United States Patent
Ishiwata et al.

(10) Patent No.: US 10,076,022 B2
(45) Date of Patent: Sep. 11, 2018

(54) NOISE REDUCING ELECTRONIC COMPONENT

(71) Applicant: Murata Manufacturing Co., Ltd., Kyoto-fu (JP)

(72) Inventors: Yu Ishiwata, Nagaokakyo (JP); Takahiro Azuma, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 15/228,519

(22) Filed: Aug. 4, 2016

(65) Prior Publication Data

US 2016/0345427 A1 Nov. 24, 2016

Related U.S. Application Data (63) Continuation of application No. PCT/JP2015/050042, filed on Jan. 5, 2015.

(30) Foreign Application Priority Data

Feb. 12, 2014 (JP) .................. 2014-024132

(51) Int. Cl.
H05K 7/14 (2006.01)
H05K 1/02 (2006.01)
(Continued)

(52) U.S. Cl.
CPC ......... *H05K 1/0216* (2013.01); *H01L 23/552* (2013.01); *H01Q 1/48* (2013.01); *H01Q 1/526* (2013.01); *H03H 7/004* (2013.01); *H05K 1/0233* (2013.01); *H05K 9/0075* (2013.01); *H01L 2224/16227* (2013.01); *H01L 2224/16235* (2013.01); *H01L 2924/15313* (2013.01);
(Continued)

(58) Field of Classification Search
CPC ............ H05K 1/0216; H05K 1/0233; H05K 2201/093; H01L 23/552
USPC .......................... 361/799, 800–820
See application file for complete search history.

(56) References Cited

U.S. PATENT DOCUMENTS 3,512,110 A * 5/1970 Clar .................. H01P 5/185
333/116
5,767,753 A * 6/1998 Ruelke ................. H01P 5/18
333/116

(Continued)

FOREIGN PATENT DOCUMENTS

| JP | 2001-211047 A | 8/2001 |
| JP | 2009-105575 A | 5/2009 |
| WO | 2010/013496 A1 | 2/2010 |

OTHER PUBLICATIONS

International Search Report issued in PCT/JP2015/050042; dated Mar. 31, 2015.

*Primary Examiner* — Steven T Sawyer
(74) *Attorney, Agent, or Firm* — Studebaker & Brackett PC (57) ABSTRACT

A noise reducing electronic component is used as mounted on a circuit board. The noise reducing electronic component includes: a floating electrode disposed so as to be capacitively coupled to a ground conductor of the circuit board; a radiation element connected to the floating electrode; and a shielding member to shield electromagnetic waves radiated from the radiation element. With this noise reducing electronic component, noise in a printed circuit board and the like can be reduced.

6 Claims, 7 Drawing Sheets

(51) Int. Cl.
*H01L 23/552* (2006.01)
*H01Q 1/48* (2006.01)
*H01Q 1/52* (2006.01)
*H03H 7/00* (2006.01)
*H05K 9/00* (2006.01)

(52) U.S. Cl.
CPC .............. *H01L 2924/19106* (2013.01); *H05K 2201/093* (2013.01)

(56) References Cited

U.S. PATENT DOCUMENTS

| | | | |
|---|---|---|---|
| 6,465,746 B1* | 10/2002 | Kajita | H03B 1/02 |
| | | | 174/260 |
| 6,483,481 B1 | 11/2002 | Sievenpiper et al. | |
| 2005/0259007 A1* | 11/2005 | Horie | H01Q 1/243 |
| | | | 343/700 MS |
| 2013/0120957 A1* | 5/2013 | Werner | H05K 9/0032 |
| | | | 361/818 |
| 2015/0043189 A1* | 2/2015 | Kitazaki | H01L 23/3121 |
| | | | 361/816 |

* cited by examiner

NOISE REDUCING ELECTRONIC COMPONENT

CROSS REFERENCE TO RELATED APPLICATIONS

This application claims benefit of priority to Japanese Patent Application 2014-024132 filed Feb. 12, 2014, and to International Patent Application No. PCT/JP2015/050042 filed Jan. 5, 2015, the entire content of which is incorporated herein by reference.

TECHNICAL FIELD

The present disclosure relates to noise reducing electronic components capable of reducing noise generated in a printed circuit board and the like.

BACKGROUND ART

Japanese Patent Laying-Open No. 2009-105575 discloses a filter that prevents propagation of a high-frequency noise current to a cable through a connector. In the filter disclosed in Japanese Patent Laying-Open No. 2009-105575, a region exhibiting high impedance is formed in a peripheral portion of a connector of a printed circuit board. The region exhibiting high impedance has an electromagnetic band gap structure having a band gap that blocks propagation of electromagnetic waves in a prescribed frequency band. U.S. Pat. No. 6,483,481 discloses a surface structure exhibiting high impedance in multiple frequency bands.

The region exhibiting high impedance includes a plurality of small conductor pieces disposed at regular intervals on a first conductor layer, a ground conductor film disposed on a second conductor layer, and a conductor post connecting the plurality of small conductor pieces to the ground conductor film.

SUMMARY

Technical Problem

The conventional techniques noted above can suppress a common mode current flowing to the ground of a connector connected to a printed circuit board. It is difficult, however, to suppress propagation of noise generated in some circuits on the printed circuit board to other circuits on the same board. The noise is thus likely to be spread across the board. The spread of noise into the board may result in secondary radiation.

An object of the present disclosure is to provide a noise reducing electronic component capable of reducing noise in a printed circuit board and the like.

Solution to Problem

According to one aspect of the present disclosure, there is provided a noise reducing electronic component to be used as mounted on a circuit board, including: a floating electrode disposed so as to be capacitively coupled to a ground conductor of the circuit board; a radiation element connected to the floating electrode; and a shielding member to shield electromagnetic waves radiated from the radiation element.

Noise generated in the ground conductor of the circuit board propagates to the floating electrode, and is radiated as electromagnetic waves from the radiation element. The radiated electromagnetic waves are shielded by the shielding member. Since the noise generated in the ground conductor of the circuit board is radiated as electromagnetic energy and consumed, noise can be reduced.

Furthermore, a ground electrode to be electrically connected to the ground conductor of the circuit board may be disposed, and the floating electrode may be capacitively coupled to the ground electrode. The floating electrode is to be capacitively coupled to the ground conductor of the circuit board through the ground electrode.

The noise reducing electronic component may have a bottom surface to be bonded to the circuit board, and the floating electrode and the ground electrode may be disposed with a gap therebetween in an in-plane direction of the bottom surface. The floating electrode is bonded to the insulating region of the circuit board, and the ground electrode is bonded to the ground conductor of the circuit board.

The noise reducing electronic component may have a bottom surface to be bonded to the circuit board, the ground electrode may be exposed at the bottom surface, and the floating electrode may be disposed on the ground electrode with a dielectric film interposed therebetween. The floating electrode is capacitively coupled to the ground electrode through the dielectric film.

The shielding member may be made of a conductive material, and may be electrically connected to the ground electrode. The electromagnetic wave shielding effect by the shielding member can be improved.

The noise reducing electronic component may further include a dielectric film to be bonded to the ground conductor of the circuit board, and the floating electrode may be disposed on the dielectric film. The floating electrode is capacitively coupled to the ground conductor of the circuit board through the dielectric film.

The shielding member may be made of a magnetic material. The electromagnetic waves can be absorbed by the magnetic material.

Advantageous Effects of Disclosure

Noise generated in the ground conductor of the circuit board propagates to the floating electrode, and is radiated as electromagnetic waves from the radiation element. The radiated electromagnetic waves are shielded by the shielding member. Since the noise generated in the ground conductor of the circuit board is radiated as electromagnetic energy and consumed, noise can be reduced.

DETAILED DESCRIPTION

First Embodiment

Figure 1A:
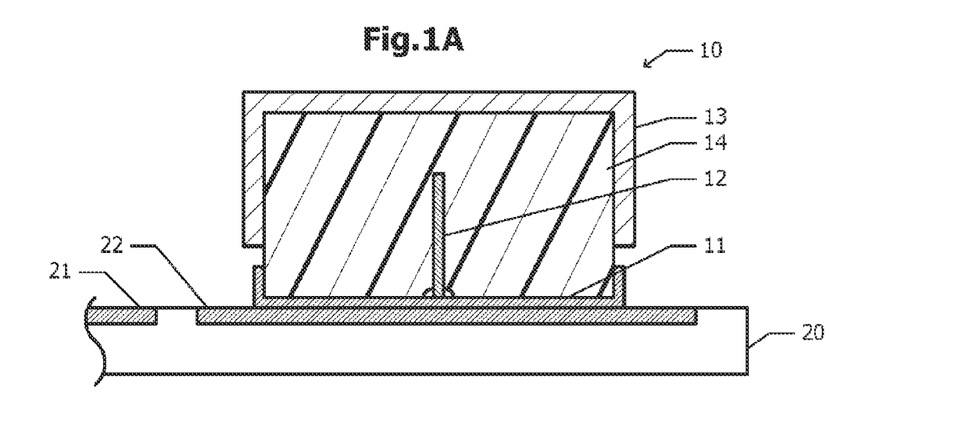
FIG. 1A is a cross-sectional view of a noise reducing electronic component according to a first embodiment.

FIG. 1A shows a cross-sectional view of a noise reducing electronic component 10 according to a first embodiment. Noise reducing electronic component 10 is used as mounted on a circuit board 20. Noise reducing electronic component 10 includes a floating electrode 11, a radiation element 12, a shielding member 13, and a filling material 14.

Floating electrode 11 forms a bottom surface of noise reducing electronic component 10. Radiation element 12 is attached to floating electrode 11. Radiation element 12 is made of a linear conductor fixed perpendicularly to the surface of floating electrode 11, for example, and operates as a monopole antenna. Electromagnetic waves radiated from radiation element 12 are shielded by shielding member 13. A conductive material such as copper or a magnetic material such as ferrite is used for shielding member 13. Space between radiation element 12 and shielding member 13 is filled with filling material 14 made of a dielectric. If shielding member 13 is made of a conductive material, shielding member 13 is electrically insulated from floating electrode 11.

Circuit board 20 includes a ground conductor 21 and a floating conductor 22. Floating conductor 22 is spaced a distance from ground conductor 21 in an in-plane direction, and is capacitively coupled to ground conductor 21. The surface of floating conductor 22 is exposed. Floating electrode 11 of noise reducing electronic component 10 is bonded to the exposed surface of floating conductor 22, and floating electrode 11 is electrically connected to floating conductor 22. With floating conductor 22 being capacitively coupled to ground conductor 21, floating electrode 11 of noise reducing electronic component 10 is also capacitively coupled to ground conductor 21 of circuit board 20.

Figure 1B:
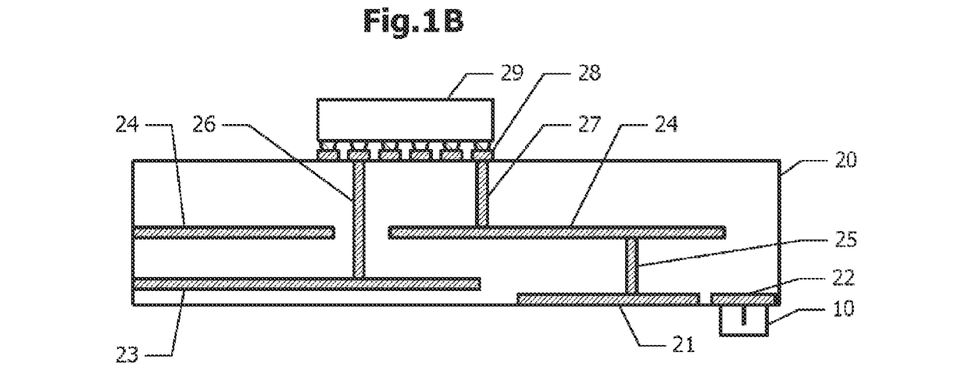
FIG. 1B is a cross-sectional view of a circuit board on which the noise reducing electronic component according to the first embodiment has been mounted.

FIG. 1B shows a cross-sectional view of circuit board 20 on which noise reducing electronic component 10 according to the first embodiment has been mounted. An integrated circuit element 29 is mounted on an element mounting surface of circuit board 20. Integrated circuit element 29 has electrodes connected to pads 28 distributed over the element mounting surface. A ground conductor film 24, a power supply conductor film 23, and signal lines are disposed in circuit board 20. Integrated circuit element 29 has a power supply terminal connected to power supply conductor film 23 by an interlayer connecting member 26, and integrated circuit element 29 has a ground terminal connected to ground conductor film 24 by an interlayer connecting member 27. On a rear surface of circuit board 20 opposite to the element mounting surface, ground conductor 21 and floating conductor 22 are disposed. Ground conductor 21 is connected to internal ground conductor film 24 by an interlayer connecting member 25. Noise reducing electronic component 10 is bonded to floating conductor 22.

Figure 1C:
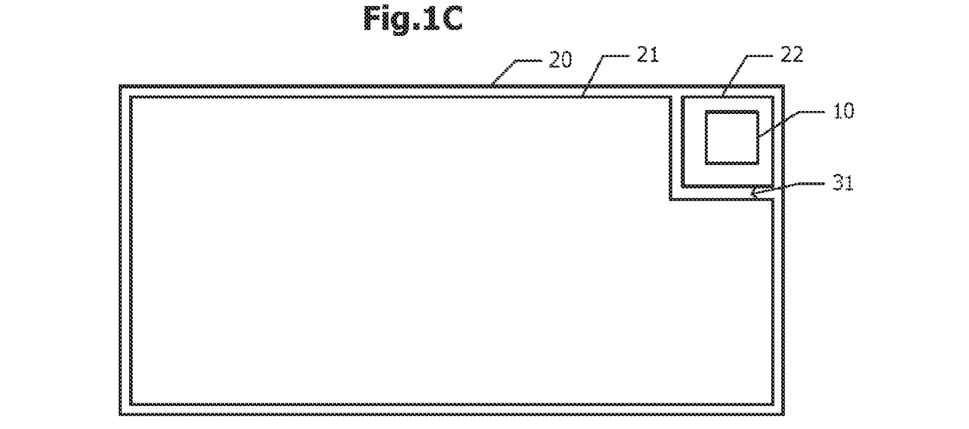
FIG. 1C is a bottom view of the circuit board on which the noise reducing electronic component according to the first embodiment has been mounted.

FIG. 1C shows a bottom view of circuit board 20. Ground conductor 21 and floating conductor 22 are disposed on the rear surface of circuit board 20. A gap 31 is secured between floating conductor 22 and ground conductor 21. Thus, floating conductor 22 is capacitively coupled to ground conductor 21. Noise reducing electronic component 10 is disposed inside floating conductor 22 as seen in plan view.

Figure 2:
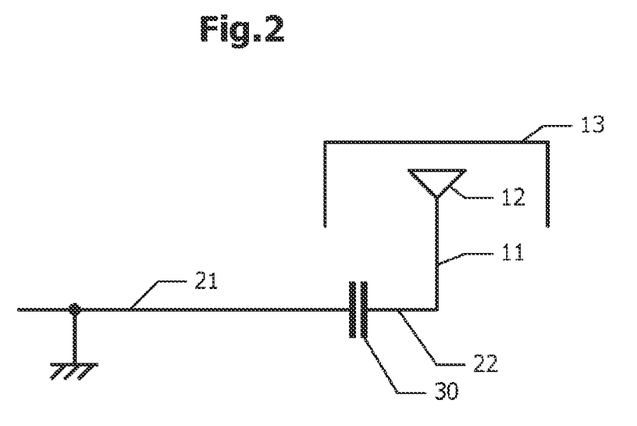
FIG. 2 is an equivalent circuit diagram of a ground conductor, a floating conductor, a radiation element, and a shielding member.

FIG. 2 shows an equivalent circuit diagram of ground conductor 21, floating conductor 22, radiation element 12, and shielding member 13. Ground conductor 21 is connected to floating conductor 22 through a capacitor 30. Capacitor 30 is based on the capacitance resulting from gap 31 between ground conductor 21 and floating conductor 22 shown in FIG. 1C. Floating conductor 22 is connected to radiation element 12 through floating electrode 11.

A noise current generated in ground conductor 21 flows to radiation element 12 through capacitor 30, causing radiation of electromagnetic waves from radiation element 12. The electromagnetic waves radiated from radiation element 12 are shielded by shielding member 13. In this manner, the noise current generated in ground conductor 21 is converted to electromagnetic energy by radiation element 12. The electromagnetic energy radiated from radiation element 12 is prevented from being radiated to the outside by shielding member 13, and is therefore ultimately consumed inside noise reducing electronic component 10. As a result, a reduction in noise level can be achieved in circuit board 20, and integrated circuit element 29 mounted thereon.

Generally, a reduction in noise level can be achieved by feeding electromagnetic noise back to ground conductor 21. When the potential of ground conductor 21 is unstable, however, the noise fed back to ground conductor 21 may adversely affect the various circuits mounted on circuit board 20. In order to address the noise in an efficient manner, it is effective to eliminate noise energy itself. In the first embodiment noted above, noise energy is radiated as electromagnetic energy, thus achieving a reduction in noise level even if the potential of ground conductor 21 is unstable. A noticeable effect of noise reduction is obtained, for example, when circuit board 20 according to the first embodiment is used as a board of a personal digital assistant.

It is preferable to determine the capacitance of capacitor 30, and the shape and dimensions of radiation element 12 in such a manner as to allow efficient radiation of electromagnetic waves in a frequency band of noise to be eliminated. For example, the capacitance of capacitor 30, and the shape and dimensions of radiation element 12 are determined in such a manner as to allow efficient radiation of electromagnetic waves corresponding to the operating frequency of integrated circuit element 29 mounted on circuit board 20. The result is an improved noise removal effect.

Figure 3:
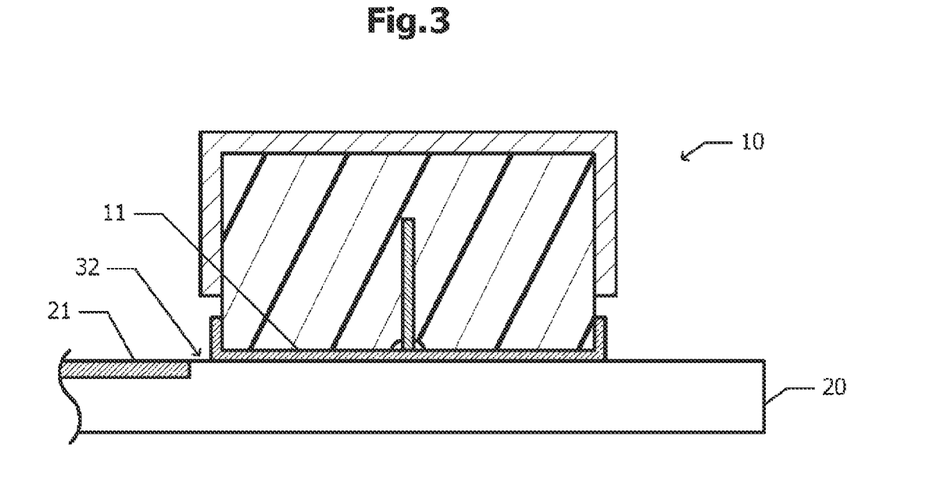
FIG. 3 is a cross-sectional view of the noise reducing electronic component and the circuit board, where the noise reducing electronic component according to the first embodiment has been mounted on the circuit board in another manner.

FIG. 3 shows a cross-sectional view of noise reducing electronic component 10 and circuit board 20, where noise reducing electronic component 10 according to the first embodiment has been mounted on circuit board 20 in an arrangement different from the arrangement shown in FIGS. 1A to 1C. In the arrangement example shown in FIGS. 1A to 1C, floating electrode 11 of noise reducing electronic component 10 is connected to floating conductor 22 of circuit board 20. In the example shown in FIG. 3, floating electrode 11 of noise reducing electronic component 10 is bonded to an insulating surface of circuit board 20. Noise reducing electronic component 10 is positioned such that floating electrode 11 of noise reducing electronic component 10 and ground conductor 21 of circuit board 20 are disposed with a gap 32 therebetween in the in-plane direction.

With gap 32 being secured between floating electrode 11 and ground conductor 21, floating electrode 11 is capacitively coupled to ground conductor 21. In the example shown in FIG. 3, the capacitance of capacitor 30 (FIG. 2) depends on the dimensions of gap 32. The dimensional accuracy of gap 32 is determined by the positioning accuracy during the mounting of noise reducing electronic component 10.

Second Embodiment

Figure 4A:
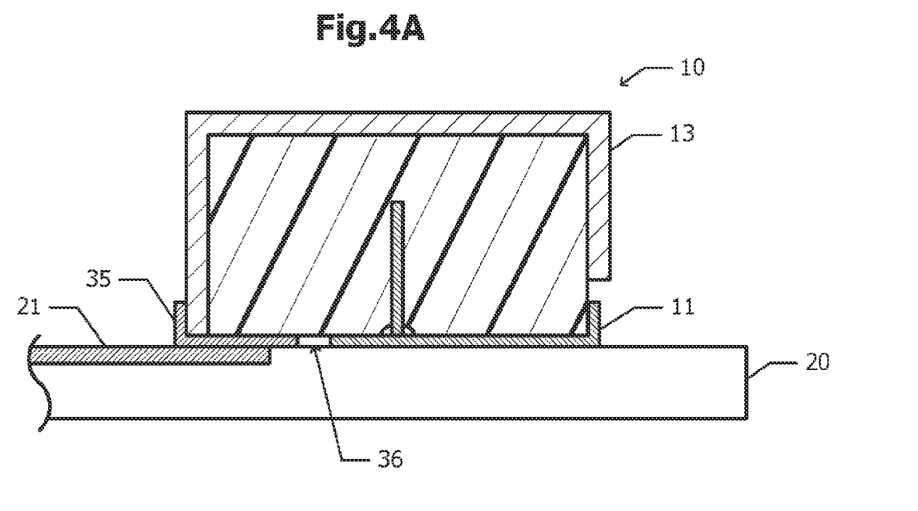
FIG. 4A is a cross-sectional view of a noise reducing electronic component according to a second embodiment.
Figure 4B:
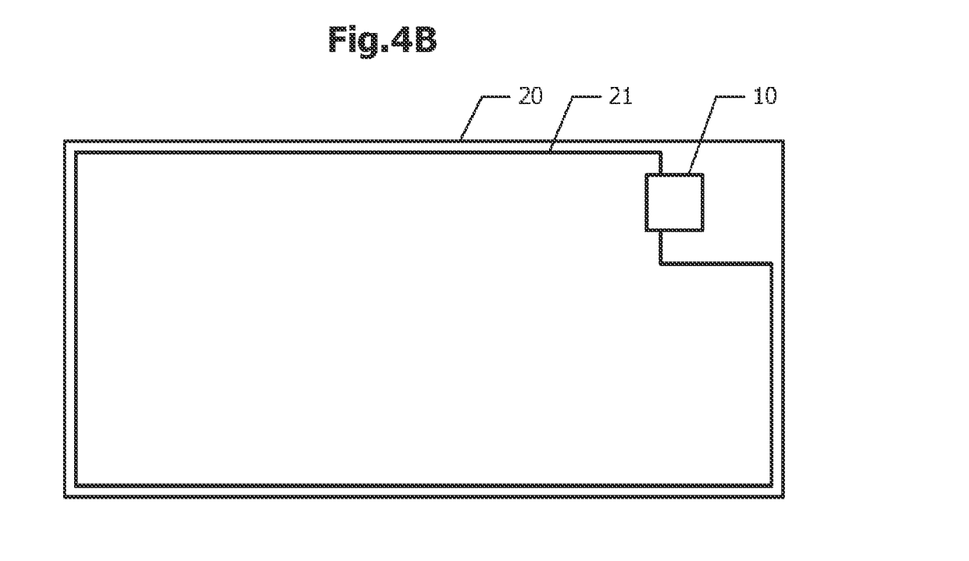
FIG. 4B is a bottom view of a circuit board on which the noise reducing electronic component according to the second embodiment has been mounted.

Referring now to FIGS. 4A and 4B, noise reducing electronic component 10 according to a second embodiment is described. The difference from the first embodiment will be noted and described below, and description of the same configuration will not be repeated.

FIG. 4A shows a cross-sectional view of noise reducing electronic component 10 according to the second embodiment. In the first embodiment, the entire bottom surface of noise reducing electronic component 10 is formed of floating electrode 11 (FIG. 1A). In the second embodiment, floating electrode 11 and a ground electrode 35 are exposed at the bottom surface of noise reducing electronic component 10. Floating electrode 11 and ground electrode 35 are disposed with a gap 36 therebetween in the in-plane direction of the bottom surface. Shielding member 13 is electrically connected to ground electrode 35.

While floating conductor 22 (FIG. 1A) is disposed in circuit board 20 on which noise reducing electronic component 10 according to the first embodiment is mounted, floating conductor 22 is not disposed in circuit board 20 on which noise reducing electronic component 10 according to the second embodiment is mounted. Ground electrode 35 of noise reducing electronic component 10 is electrically connected to ground conductor 21 of circuit board 20. Floating electrode 11 is bonded to the insulating surface of circuit board 20.

FIG. 4B shows a bottom view of circuit board 20 on which noise reducing electronic component 10 according to the second embodiment has been mounted. Noise reducing electronic component 10 is disposed so as to straddle the boundary between ground conductor 21 and the insulating region.

In the second embodiment, floating electrode 11 of noise reducing electronic component 10 is capacitively coupled to ground electrode 35, and ground electrode 35 is connected to ground conductor 21 of circuit board 20. Thus, floating electrode 11 of noise reducing electronic component 10 is capacitively coupled to ground conductor 21 of circuit board 20. In the second embodiment, the capacitance of capacitor 30 (FIG. 2) depends on the dimensions of gap 36. Accordingly, the accuracy of capacitance of capacitor 30 (FIG. 2) is determined by the assembling accuracy of floating electrode 11 and ground electrode 35.

Moreover, in the second embodiment, shielding member 13 is electrically insulated from floating electrode 11, and is electrically connected to ground electrode 35. Thus, shielding member 13 is connected to ground conductor 21 of circuit board 20. The result is an improved electromagnetic wave shielding effect by shielding member 13. If shielding member 13 is made of a magnetic material, shielding member 13 and ground electrode 35 do not need to be connected together.

Third Embodiment

Figure 5A:
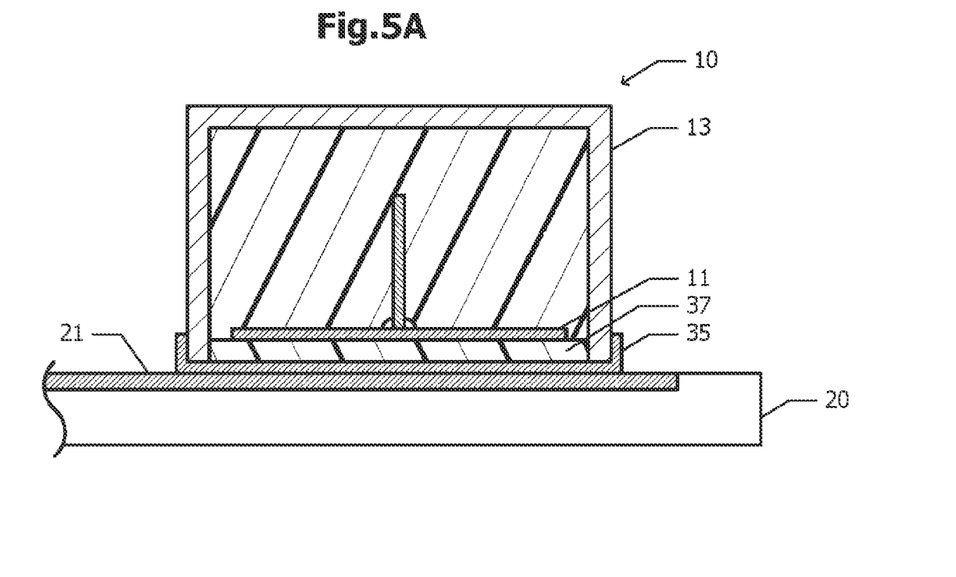
FIG. 5A is a cross-sectional view of a noise reducing electronic component according to a third embodiment.
Figure 5B:
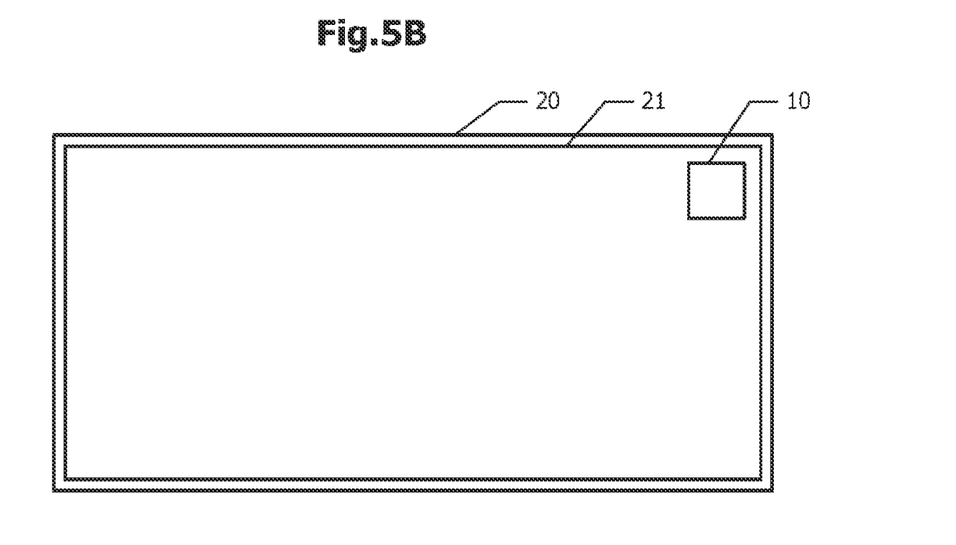
FIG. 5B is a bottom view of a circuit board on which the noise reducing electronic component according to the third embodiment has been mounted.

Referring to FIGS. 5A and 5B, noise reducing electronic component 10 according to a third embodiment is described. The difference from the first embodiment will be noted and described below, and description of the same configuration will not be repeated.

FIG. 5A shows a cross-sectional view of noise reducing electronic component 10 according to the third embodiment. Ground electrode 35 is exposed at the entire bottom surface of noise reducing electronic component 10. Floating electrode 11 is disposed on ground electrode 35 with a dielectric film 37 interposed therebetween. Shielding member 13 is electrically connected to ground electrode 35, and is electrically insulated from floating electrode 11. Ground electrode 35 is electrically connected to ground conductor 21 of circuit board 20. Shielding member 13 is, as in the second embodiment shown in FIG. 4A, connected to ground conductor 21 of circuit board 20 with ground electrode 35 interposed therebetween.

FIG. 5B shows a bottom view of circuit board 20 on which noise reducing electronic component 10 according to the third embodiment has been mounted. Noise reducing electronic component 10 is disposed inside ground conductor 21 as seen in plan view.

In the third embodiment, ground electrode 35 and floating electrode 11 facing each other with dielectric film 37 interposed therebetween form capacitor 30 (FIG. 2).

Fourth Embodiment

Figure 6:
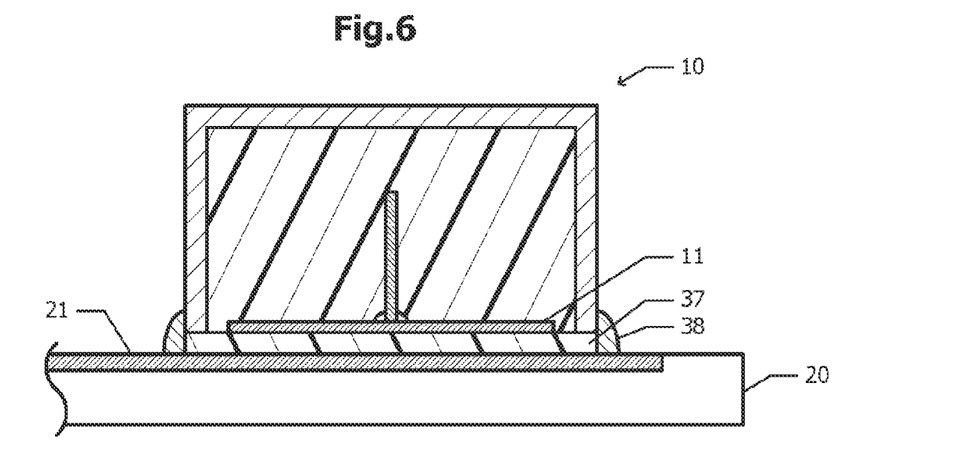
FIG. 6 is a cross-sectional view of a noise reducing electronic component according to a fourth embodiment.

FIG. 6 shows a cross-sectional view of noise reducing electronic component 10 according to a fourth embodiment. The difference from noise reducing electronic component 10 according to the third embodiment shown in FIGS. 5A and 5B will be noted and described below, and description of the same configuration will not be repeated.

In the fourth embodiment, ground electrode 35 of the third embodiment is not provided, and dielectric film 37 is exposed at the bottom surface of noise reducing electronic component 10. Dielectric film 37 is bonded to ground conductor 21 of circuit board 20. Floating electrode 11 is disposed on ground conductor 21 with dielectric film 37 interposed therebetween. Thus, floating electrode 11 is capacitively coupled to ground conductor 21.

A conductive material 38 is disposed at a portion where the lower end of a side surface of noise reducing electronic component 10 and ground conductor 21 are in contact with each other. Conductive material 38 electrically connects shielding member 13 to ground conductor 21. If a magnetic material is used as shielding member 13, conductive material 38 does not need to be disposed.

Fifth Embodiment

Figure 7A:
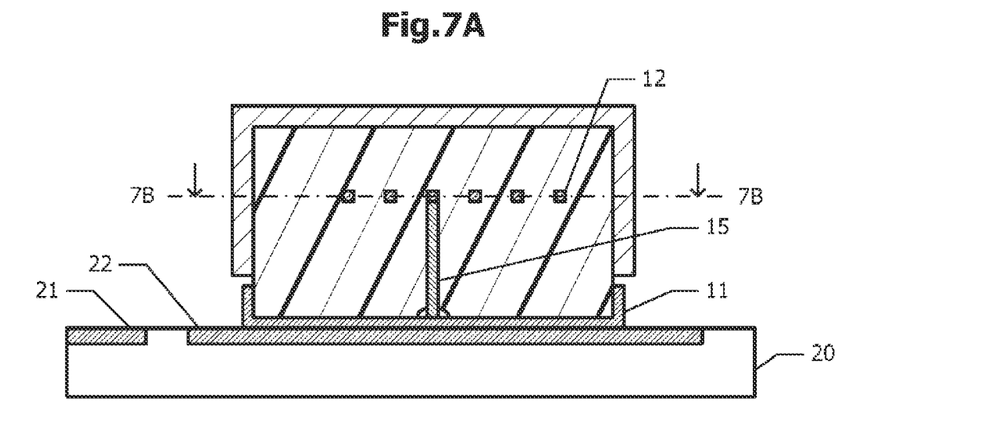
FIG. 7A is a cross-sectional view of a noise reducing electronic component according to a fifth embodiment.
Figure 7B:
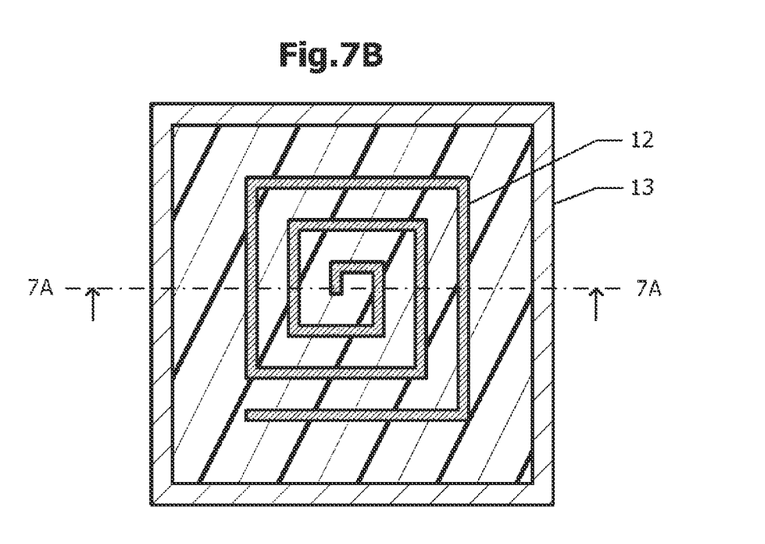
FIG. 7B is a cross-sectional view taken along a chain-dotted line 7B-7B in FIG. 7A.

Referring to FIGS. 7A and 7B, noise reducing electronic component 10 according to a fifth embodiment is described. The difference from the first to fourth embodiments will be noted and described below, and description of the same configuration will not be repeated. In the first to fourth embodiments, a monopole antenna is used as radiation element 12. In the fifth embodiment, a spiral antenna is used as radiation element 12.

FIG. 7A shows a cross-sectional view of noise reducing electronic component 10 according to the fifth embodiment. FIG. 7B shows a plan cross-sectional view taken along a chain-dotted line 7B-7B in FIG. 7A. FIG. 7A corresponds to a cross-sectional view taken along a chain-dotted line 7A-7A in FIG. 7B. From floating electrode 11, a conductive post 15 extends substantially perpendicularly to the surface of the floating electrode. Radiation element 12 made of a spiral-shaped linear conductor is attached to the tip of post 15.

It is noted that a patch antenna may be used as radiation element 12. For radiation element 12, it is preferable to use an antenna most likely to radiate electromagnetic waves in a frequency band of noise to be eliminated.

Although the present disclosure has been described with reference to the embodiments, the present disclosure is not limited thereto. It would be obvious for those skilled in the art, for example, that a variety of variations, modifications, combinations and the like can be made.

The invention claimed is:

1. A noise reducing electronic component to be used as mounted on a circuit board, comprising:
   a floating electrode disposed so as to be capacitively coupled to a ground conductor of the circuit board;
   a radiation element connected to the floating electrode and configured to radiate electromagnetic waves; and
   a shielding member made of magnetic material to shield the electromagnetic waves radiated from the radiation element,
   the radiation element being made of a liner conductor having a tip end and a base end,
   the base end being connected to the floating electrode, and
   a lateral direction of the tip end and an extending direction of the radiation element from the tip end being covered with the shielding member.

2. The noise reducing electronic component according to claim 1, further comprising a ground electrode to be electrically connected to the ground conductor of the circuit board, wherein
   the floating electrode is to be capacitively coupled to the ground electrode.

3. The noise reducing electronic component according to claim 2, wherein
   the noise reducing electronic component has a bottom surface to be bonded to the circuit board, and
   the floating electrode and the ground electrode are disposed with a gap therebetween in an in-plane direction of the bottom surface.

4. The noise reducing electronic component according to claim 2, wherein
   the noise reducing electronic component has a bottom surface to be bonded to the circuit board, and
   the ground electrode is exposed at the bottom surface, and the floating electrode is disposed on the ground electrode with a dielectric film interposed therebetween.

5. The noise reducing electronic component according to claim 2, wherein
   the shielding member is made of a conductive material, and is electrically connected to the ground electrode.

6. The noise reducing electronic component according to claim 1, wherein
   the noise reducing electronic component further comprises a dielectric film to be bonded to the ground conductor of the circuit board, and
   the floating electrode is disposed on the dielectric film.

* * * * *